US012810931B2

(12) United States Patent
Conte et al.

(10) Patent No.: US 12,810,931 B2
(45) Date of Patent: Nov. 24, 2026

(54) INTEGRATED CIRCUIT INCLUDING A PHYSICALLY UNCLONABLE FUNCTION DEVICE AND CORRESPONDING METHOD FOR IMPLEMENTING A PHYSICALLY UNCLONABLE FUNCTION

(71) Applicants: STMICROELECTRONICS S.r.l., Agrate Brianza (IT); STMICROELECTRONICS (ROUSSET) SAS, Rousset (FR)

(72) Inventors: Antonino Conte, Tremestieri Etneo (IT); Francesco La Rosa, Rousset (FR)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 159 days.

(21) Appl. No.: 18/978,540

(22) Filed: Dec. 12, 2024

(65) Prior Publication Data

US 2025/0111876 A1 Apr. 3, 2025

Related U.S. Application Data

(63) Continuation of application No. 18/158,232, filed on Jan. 23, 2023, now Pat. No. 12,198,756.

(30) Foreign Application Priority Data

Jan. 27, 2022 (FR) ....................................... 2200693

(51) Int. Cl.
*G11C 13/00* (2006.01)
*H10W 42/40* (2026.01)

(52) U.S. Cl.
CPC ........ *G11C 13/0004* (2013.01); *G11C 13/004* (2013.01); *G11C 13/0069* (2013.01); *H10W 42/405* (2026.01)

(58) Field of Classification Search
CPC ................................. G09C 1/00; G11C 13/00
See application file for complete search history.

(56) References Cited

U.S. PATENT DOCUMENTS

| | | | |
|---|---|---|---|
| 9,985,791 | B2 | 5/2018 | Cambou |
| 10,439,829 | B1 | 10/2019 | Lin et al. |

(Continued)

FOREIGN PATENT DOCUMENTS

| | | | |
|---|---|---|---|
| CN | 111314058 | A | 6/2020 |
| CN | 113297634 | A | 8/2021 |

*Primary Examiner* — Jason Lappas
(74) *Attorney, Agent, or Firm* — Seed IP Law Group LLP

(57) ABSTRACT

Unclonable function circuitry includes a plurality of pairs of phase-change memory cells in a virgin state, and sensing circuitry coupled to the plurality of pairs of phase-change memory cells in the virgin state. The sensing circuitry identifies a subset of the plurality of pairs of phase-change memory cells in the virgin state based on a reliability mask. Signs of differences of effective resistance values of the identified subset of the plurality of pairs of phase-change memory cells in the virgin state are sensed by the sensing circuitry. The sensing circuitry generates a string of bits based on the sensed signs of differences in the effective resistance values of the identified subset of the plurality of pairs of phase-change memory cells in the virgin state. Processing circuitry coupled to the unclonable function circuitry, in operation, executes one or more operations using the generated string of bits.

19 Claims, 5 Drawing Sheets

(56) References Cited

U.S. PATENT DOCUMENTS

| | | | |
|---|---|---|---|
| 2014/0137266 A1 | 5/2014 | Chang | |
| 2015/0188717 A1 | 7/2015 | Wu et al. | |
| 2016/0156476 A1 | 6/2016 | Lee et al. | |
| 2018/0278418 A1 | 9/2018 | Chang et al. | |
| 2018/0337777 A1 | 11/2018 | Shieh et al. | |
| 2019/0305973 A1 | 10/2019 | Dewan | |
| 2021/0243042 A1 | 8/2021 | Ahn et al. | |
| 2022/0301609 A1 | 9/2022 | Chang et al. | |
| 2023/0238060 A1* | 7/2023 | Conte ...................... | G09C 1/00<br>365/148 |

* cited by examiner

INTEGRATED CIRCUIT INCLUDING A PHYSICALLY UNCLONABLE FUNCTION DEVICE AND CORRESPONDING METHOD FOR IMPLEMENTING A PHYSICALLY UNCLONABLE FUNCTION

BACKGROUND

Technical Field

Embodiments and implementations are related to physically unclonable functions, in particular obtained from a phase-change memory device.

Description of the Related Art

A physical unclonable function "PUF" refers to a disordered system capable to produce an unpredictable but stable answer to a defined challenge. The unpredictability of the answer means that two creations of the same PUF circuit are able to provide different answers to the same challenge, in a statistically acceptable distribution. The stability of the answer means that one creation of a PUF circuit would always provide the same answer to the same challenge.

Some classical PUF circuits are capable to produce multiple couples of challenge-answer, and some PUF circuits are not intended for receiving multiple challenges, referred as no challenge cases. In no challenge cases, the PUF circuit outputs are an unpredictable string of bits, for example used to identify the device from which it is generated. Such unique identification string of bits can be used to generate a secret key for instance intended for a public key cryptography technique.

Accordingly, in addition of being unpredictable and stable, it is beneficial that the answer, the string of bits, is not observable with optical or electronic microscopy techniques.

In practice, PUFs are used in many electronic devices such as microcontrollers and embedded microprocessors, for example, in authentication applications, cryptographic applications, etc.

BRIEF SUMMARY

In an embodiment, unclonable function circuitry includes a plurality of pairs of phase-change memory cells in a virgin state, and sensing circuitry coupled to the plurality of pairs of phase-change memory cells in the virgin state. The sensing circuitry identifies a subset of the plurality of pairs of phase-change memory cells in the virgin state based on a reliability mask. Signs of differences of effective resistance values of the identified subset of the plurality of pairs of phase-change memory cells in the virgin state are sensed by the sensing circuitry. The sensing circuitry generates a string of bits based on the sensed signs of differences in the effective resistance values of the identified subset of the plurality of pairs of phase-change memory cells in the virgin state. Processing circuitry coupled to the unclonable function circuitry, in operation, executes one or more operations using the generated string of bits.

In an embodiment, a method for implementing a physically unclonable function is provided. A subset of a plurality of pairs of phase-change memory cells in a virgin state is identified based on a reliability mask. Signs of differences of effective resistance values of the identified subset of the plurality of pairs of phase-change memory cells in the virgin state are sensed. A string of bits is generated based on the sensed signs of differences in the effective resistance values of the identified subset of the plurality of pairs of phase-change memory cells in the virgin state. One or more processing operations is performed using the generated string of bits.

In an embodiment a system includes processing circuitry and unclonable function circuitry coupled to the processing circuitry. The processing circuitry, in operation, executes an application. The unclonable function circuitry, in operation, identifies a subset of a plurality of pairs of phase-change memory cells in a virgin state based on a reliability mask. Signs of differences of effective resistance values of the identified subset of the plurality of pairs of phase-change memory cells in the virgin state are sensed by the unclonable function circuitry. The unclonable function circuitry generates a string of bits based on the sensed signs of differences in the effective resistance values of the identified subset of the plurality of pairs of phase-change memory cells in the virgin state. In operation, the generated string of bits is used by the application.

In an embodiment, a non-transitory computer-readable medium's contents configure processing circuitry to perform a method. The method comprises identifying a subset of a plurality of pairs of phase-change memory cells in a virgin state based on a reliability mask; sensing signs of differences of effective resistance values of the identified subset of the plurality of pairs of phase-change memory cells in the virgin state; generating a string of bits based on the sensed signs of differences in the effective resistance values of the identified subset of the plurality of pairs of phase-change memory cells in the virgin state; and performing one or more processing operations using the generated string of bits.

BRIEF DESCRIPTION OF THE SEVERAL VIEWS OF THE DRAWINGS

Other advantages and features shall appear with a close inspection of the detailed description of embodiments of the disclosure, in no way limiting, in relation with the attached drawing on which.

DETAILED DESCRIPTION

Figure 1A:
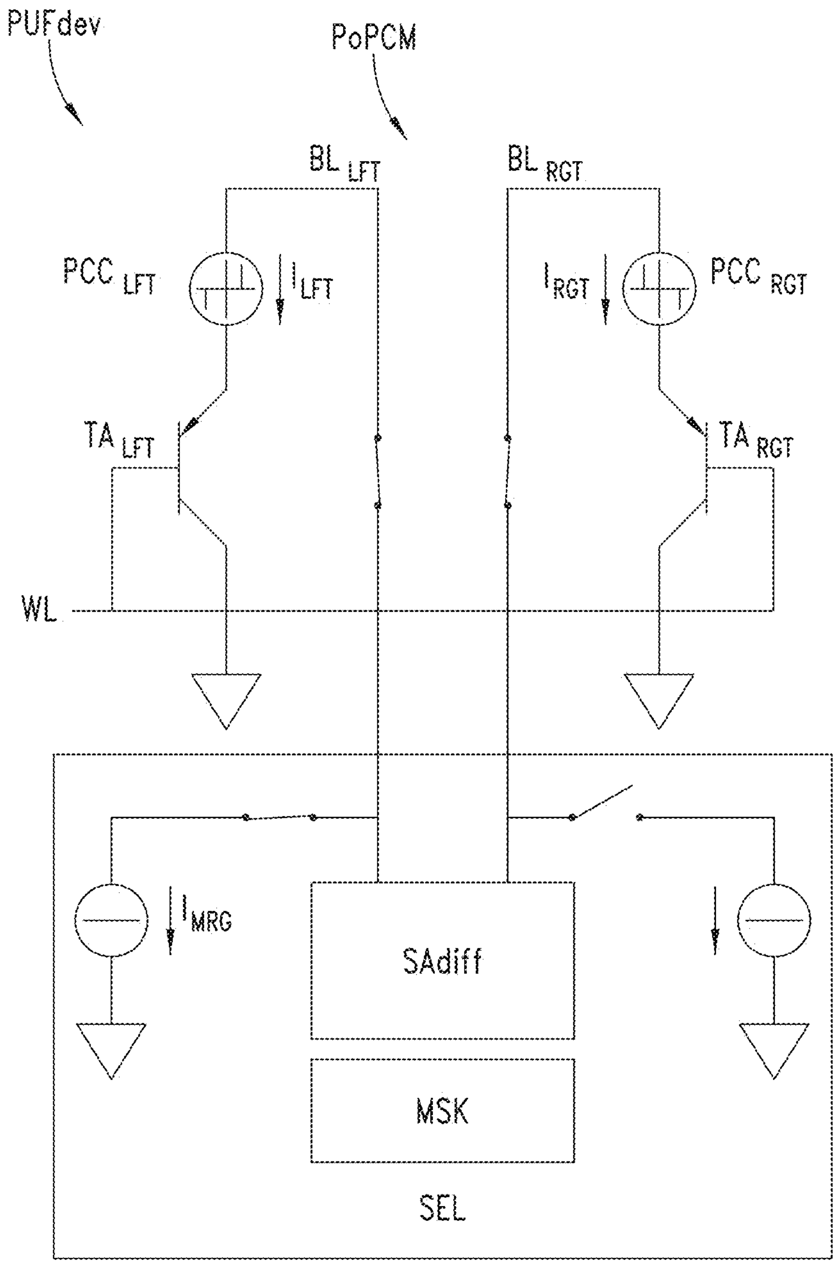
FIGS. 1A and 1B are functional block diagrams of an embodiment of a physical unclonable function device.
Figure 1B:
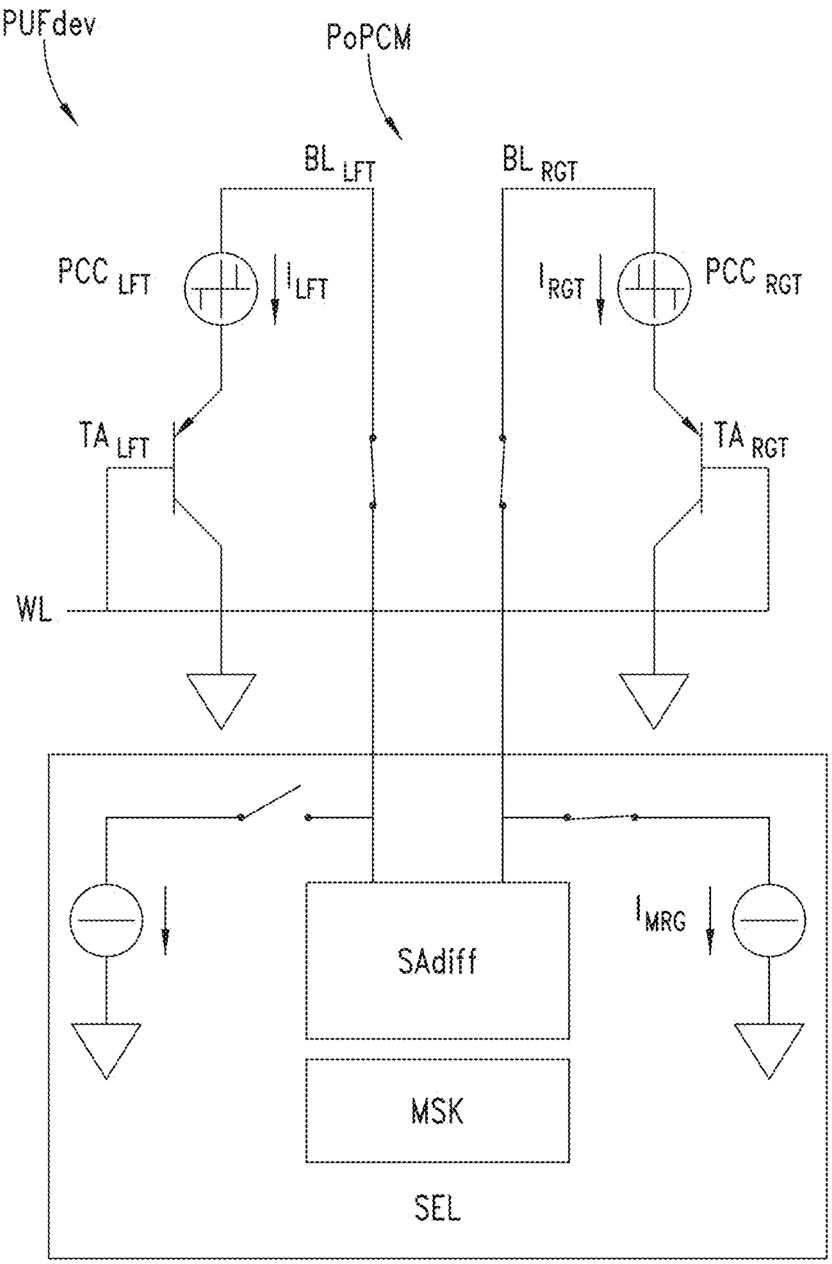

FIGS. 1A and 1B illustrate an example of a physically unclonable function device PUFdev based on phase change memory cells $PCM_{LFT}$, $PCM_{RGT}$ in a virgin state, incorporated in an integrated circuit for instance.

Conventional phase change memory cells $PCM_{LFT}$, $PCM_{RGT}$ are typically capable to switch between a first state having a first electrical resistive value, and a second state having a second electrical resistive value. For example, the first state can be obtained by a polycrystalline phase of a phase change material having a relatively low resistive value, and the second state can be obtained by an amorphous phase of the material having a relatively high resistive value. Switching between polycrystalline phase and amorphous phase can be achieved by a heater element capable to either quickly heat and cool down the material, called a reset operation making the material amorphous, or to hold it in its crystallization temperature range for a sufficient time, called set operation making the material polycrystalline. The virgin state of a cell, e.g., the state of a cell when manufactured and before any set or reset operations, is typically the polycrystalline phase. The resistive values can be sensed for instance by measuring the intensity of a reading current $I_{LFT}$, $I_{RGT}$ flowing through the phase change material of the cells $PCM_{LFT}$, $PCM_{RGT}$ when polarized to a given preloading voltage. In the same example as before, the first state can be sensed if the intensity $I_{LFT}$, $I_{RGT}$ is higher than a threshold, and the second state can be sensed if the intensity $I_{LFT}$, $I_{RGT}$ is lower than the threshold. Each state can be arbitrarily chosen to translate a respective "0" or "1" binary data.

In practice, one binary data can be stored in a differential pair of cells PoPCM arranged in a given orientation $PCM_{LFT}$, $PCM_{RGT}$, where a negative difference between the reading currents "$I_{LFT}-I_{RGT}$" of the pairs of cells in the orientation provides a binary data, for instance by convention "0", and where a positive difference between the reading currents "$I_{LFT}-I_{RGT}$" in this orientation provides the other binary data, for instance by convention "1".

The physically unclonable function device PUFdev comprises a plurality of differential pairs of phase-change memory cells PoPCM.

Each pair of phase change memory cells PoPCM comprises a first phase change memory cell $PCC_{LFT}$ oriented in an arbitrary left position as illustrated, and a second phase change memory cell $PCC_{RGT}$ oriented in an arbitrary right position as illustrated.

Figure 3:
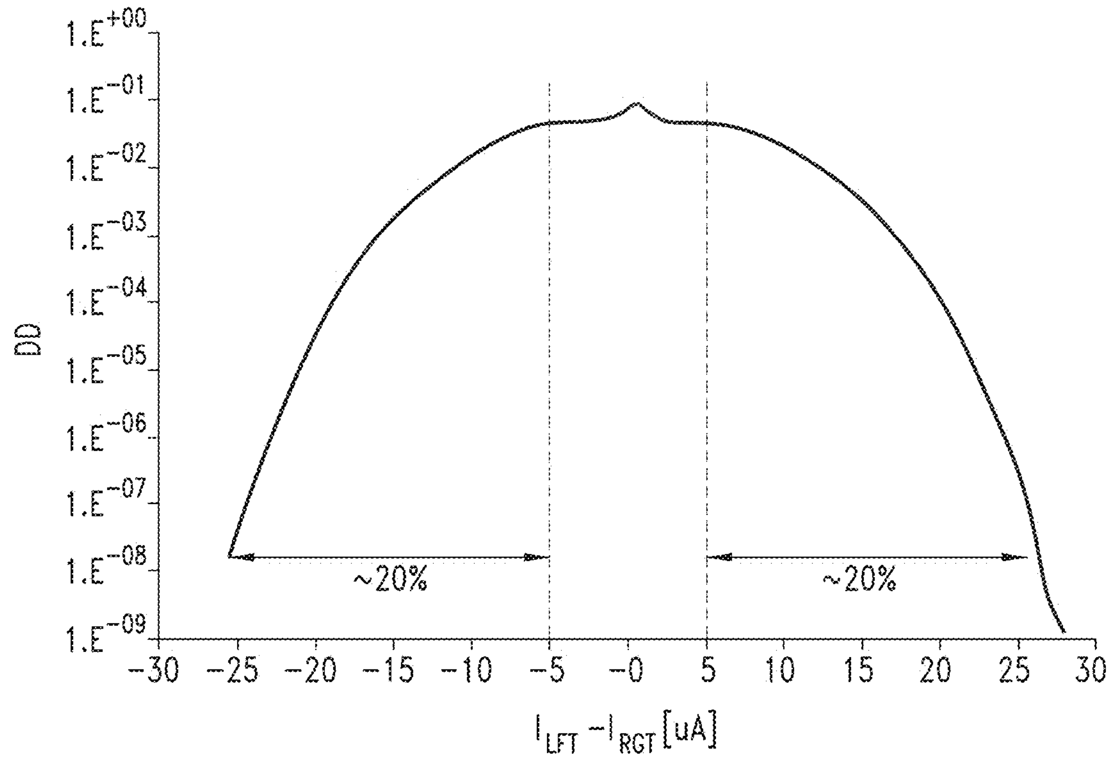
FIG. 3 illustrates a distribution, in a logarithmical scale, of the differences of reading currents in a population of pairs of phase-change memory cells according to an embodiment.

Both cells $PCC_{LFT}$, $PCC_{RGT}$ of each pair PoPCM are kept in a virgin state and according have respective effective resistive value corresponding to its proportional reading current $I_{LFT}$, $I_{RGT}$. The distinct respective effective resistive values $I_{LFT}$, $I_{RGT}$ are for instance distributed as depicted by FIG. 3 described after.

The differential pairs of cells PoPCM may be arranged in a phase change memory array PCMARR (FIG. 2), in ranges and columns of pairs of cells PoPCM. Ranges of differential pairs of cells PoPCM may be selectable by respective word lines WL, for example controlling a respective selection transistor $TA_{LFT}$, $TA_{RGT}$ serially coupled between ground and the respective phase change memory cell $PCC_{LFT}$, $PCC_{RGT}$. Columns of differential pairs of cells PoPCM may be selectable by respective differential pairs of bit lines $BL_{LFT}$, $BL_{RGT}$, for example serially coupled to the other terminal of the cell $PCC_{LFT}$, $PCC_{RGT}$.

The differential bit lines $BL_{LFT}$, $BL_{RGT}$ are coupled to inputs of a differential sensing means, such as a conventional differential sense amplifier SAdiff, included within selection means SEL. The differential sensing means SAdiff are configured to sense the sign of the difference between the effective resistive values $I_{LFT}$, $I_{RGT}$ of the sensed pair of cells PoPCM. For that purpose, the differential sensing means SAdiff may be configured to polarize the differential bit lines $BL_{LFT}$, $BL_{RGT}$ at a preloading voltage and to measure the intensity of the current $I_{LFT}$, $I_{RGT}$ flowing through respective cells $PCC_{LFT}$, $PCC_{RGT}$. The sensed current is proportional to the resistive value of the cell according to Ohm's law applied with the preloading voltage.

The differential sensing means SAdiff may be configured to provide a physically unclonable random string of bits, wherein each bit is based on the sensed sign of the respectively sensed pair of cells PoPCM. For example, the differential sensing means SAdiff may be configured according to the orientation of the example expressed before, to provide the binary data "0" if "$I_{LFT}<I_{RGT}$", and to provide the binary data "1" if "$I_{LFT}>I_{RGT}$".

That being said, the virgin state's resistive values of the cells could statistically be equal or very close, and the corresponding intensity of the reading currents $I_{LFT}$, $I_{RGT}$ may be too similar to be compared with certainty and reliability.

Thus, the selection means SEL include an identification mask MSK adapted to identify unreliable pairs of cells PoPCM whose absolute difference between the effective resistive values is less than a margin value, expressed $I_{MRG}$, and to identify reliable pairs of cells PoPCM whose absolute difference between the effective resistive values is greater than the margin value $I_{MRG}$.

The differential sensing means SAdiff are configured to sense the sign of the difference between the effective resistive values $I_{LFT}$, $I_{RGT}$ of the reliable pairs of cells $PCM_{LFT}$, $PCM_{RGT}$ identified by the identification mask MSK only.

The unreliable and reliable pairs of cells PoPCM may be identified during an electrical wafer sorting stage of the integrated circuit.

In order to identify the reliable and unreliable pairs of cells, the selection means SEL are advantageously configured to firstly generate a margin current $I_{MRG}$ in a first differential reading path $BL_{LFT}$ of the differential sensing means SAdiff and to sense the "first state" of the differential pair of cells PoPCM. The margin current $I_{MRG}$ is for instance added to the reading current $I_{LFT}$ on the left-side bit line $BL_{LFT}$ inputted to the sensing means SAdiff, thanks to a switch circuit intended for this purpose, as illustrated by FIG. 1A.

Secondly, the selection means SEL are advantageously configured to generate the same margin current $I_{MRG}$ in the second differential reading path $BL_{RGT}$ of the differential sensing means SAdiff and to sense the "second state" of the differential pair of cells PoPCM. The margin current $I_{MRG}$ is for instance added to the reading current $I_{RGT}$ on the right-side bit line $BL_{RGT}$ inputted to the sensing means SAdiff, thanks to the switch circuit intended for this purpose, as illustrated by FIG. 1B.

If the first state and the second state are the same, then it means that the absolute difference between the two reading currents $I_{LFT}$, $I_{RGT}$ is greater than the margin current $I_{MRG}$, and that the sensed pair of cells PoPCM is to be identified as a reliable pair.

In other words, if the first sensing operation and the second sensing operation both read a "0", it means that "$I_{LFT}+I_{MRG}<I_{RGT}$", e.g., "$I_{LFT}-I_{RGT}<-I_{MRG}$"; and conversely, if the first sensing operation and the second sensing operation both read a "1", it means that "$I_{LFT}>I_{RGT}+I_{MRG}$", e.g., "$I_{LFT}-I_{RGT}>+I_{MRG}$".

If the first state and the second state are not the same, then it means that the absolute difference between the two reading currents $I_{LFT}$, $I_{RGT}$ is smaller than the margin current $I_{MRG}$, and that the sensed pair of cells PoPCM is to be identified as an unreliable pair.

In other words, if the first sensing operation reads a "1" and the second sensing operation reads a "0", it means that "$I_{LFT}+I_{MRG}>I_{RGT}$" and "$I_{LFT}<I_{RGT}+I_{MRG}$", e.g., "$-I_{MRG}<I_{LFT}-I_{RGT}<+I_{MRG}$".

The intensity of the margin current $I_{MRG}$ may thus advantageously be chosen in accordance with the precision of the differential reading means SAdiff, taking into account for instance dissymmetry in differential reading paths and/or residual circuit offsets in the differential reading means SAdiff.

Figure 2:
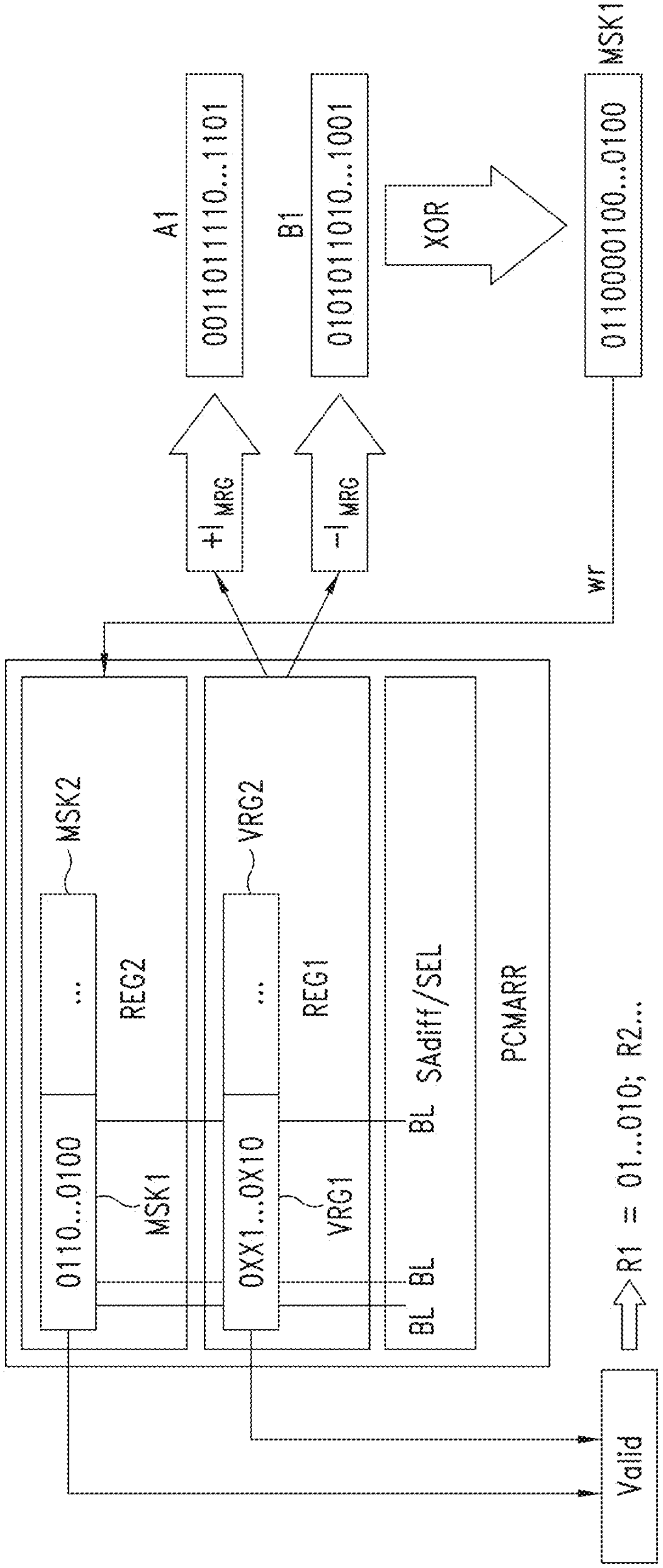
FIG. 2 is a functional block diagram of an embodiment of a phase change memory array including differential pairs of cells implementing an embodiment of a physically unclonable function device.

FIG. 2 illustrates an advantageous example implementation of the identification mask MSK of the physically unclonable function device PUFdev described in relation with FIGS. 1A and 1B, in a phase change memory array PCMARR.

The phase-change memory array PCMARR includes the plurality of pairs of cells in a virgin state, providing the physically unclonable function device PUFdev, in a first region REG1. The phase-change memory array PCMARR additionally includes a second region REG2 comprising a plurality of second pairs of cells in written states, in order to store the data of the identification mask MSK1, MSK2. The phase-change memory array PCMARR may also include another region intended for non-volatile memorization of general-purpose data.

The identification mask MSK1, MSK2 contains unreliability flags and reliability flags, which are data adapted to indicate if the pairs of virgin cells are identified as reliable pairs or unreliable pairs. For instance, the identification mask in arranged in words MSK1, MSK2 for each respective words VRG1, VRG2 of pairs of virgin cells.

As described above in relation with FIGS. 1A and 1B, the unreliability flags and reliability flags are obtained thanks to a comparison between a first sensing operation with a positively biasing margin current $+I_{MRG}$, and a second sensing operation with a negatively biasing margin current $-I_{MRG}$.

For each word VRG1, VRG2 of pairs of virgin cells, a first string A1 of data is obtained by the first sensing operation, and a second string B1 of data is obtained by the second sensing operation. A bitwise exclusive-or operation XOR between the first string A1 and the second string B1 provides an output string of data, forming the identification mask MSK1, MSK2 of the respective word VRG1, VRG2.

The data “0” in the identification mask are the unreliability flags indicating the unreliable pairs of cells, while the data “1” in the identification mask are the reliability flags indicating the reliable pairs of cells.

The output string of data of the identification mask MSK1, MSK2 is then stored in a non-volatile memory.

The operation of generating the unreliability and reliability flags of the mask is repeated until the full first region is explored and identified unreliable or reliable.

In an optimized embodiment for providing a link between the mask and the addresses of the pairs of virgin cells, the first region REG1 and the second region REG2 can have the same size and a common arrangement in terms of word lines and bit lines BL. The position in the second region REG2 of each second pair of written cells can be analogous to the position in the first region REG1 of each respective pair of virgin cells. Accordingly, the analogous positions provide, by design, the said link with the respective memory addresses. For instance, the analog positions can be designed such that a given pair of virgin cells in the first region REG1 and the corresponding pair of written cells in the second region REG2 are selected by the same differential bit lines BL. A switching or decoding circuit can thus provide, in an architecturally optimized manner, both the reading condition from the mask MSK1 and the data of the physically unclonable string of bits.

In an alternative embodiment, the identification mask MSK1, MSK2 may be stored in a distinct non-volatile memory, such as an EEPROM (“Electrically Erasable and Programmable Read Only Memory”) of Flash non-volatile memory circuits, together with the addresses of the respective pairs of virgin cells, or the addresses of the respective words of pairs of virgin cells VRG1, VRG2.

In this alternative embodiment, the sensing means may command a reading of the mask’s data corresponding to the addresses of the physically unclonable function pairs of virgin cells, and apply the selection of the reliable pairs to generate the physically unclonable random string of bits R1, R2.

Such an alternative embodiment may be advantageous in certain configurations, for instance to provide the phase-change memory based physically unclonable function device PUFdev in a circuit initially provided with a distinct non-volatile memory, but not provided with a phase-change memory array, so that writing means and operations do not have to be additionally included in the initial circuit.

The sensing operation, for instance performed during a use stage of the integrated circuit, accordingly comprises a selection “Valid”, from the identification mask MSK1, MSK2, of the reliable pairs of virgin cells used to generate a random sequence of bits R1, R2, while the unreliable pairs of virgin cells are eliminated from the random sequence of bits R1, R2.

A complete random sequence can be generated from concatenation of the valid patterns R1+R2+ . . . obtained from a series of word of pairs of virgin cells VRG1, VRG2.

It is noted that the physically unclonable portion REG1 of the phase change memory array PCMARR remains virgin, e.g., the information contained in the physically unclonable portion REG1 is undetectable by optical or electronic microscopy, since all cells are in their original polycrystalline state and have not been subjected to set/reset operations. Also, the written state of the second region REG2 may provide, by optical or electronic microscopy, the information about which ones of the pairs of virgin cells are reliable and used, but, as a matter of fact, won’t provide further information about the content of these reliable pairs of virgin cells.

FIG. 3 illustrates a distribution, in a logarithmical scale, of the differences $I_{LFT}-I_{RGT}$ of the reading currents, in micro ampere [uA], experimentally measured in a population of pairs of phase-change memory cells in virgin states as described before in relation with FIGS. 1A, 1B and 2.

The differences $I_{LFT}-I_{RGT}$ of the reading currents are measured under the same preloading voltage and are thus directly representative of the differences between the difference between the effective resistive values of the pairs of virgin cells.

Since the individual resistive values of virgin cells have a gaussian distribution and a given stability, their difference is gaussian and stable as well. Thus, the differential sensing of reading currents $I_{LFT}-I_{RGT}$ preserves the unpredictability and the stability of the distribution of virgin resistive values.

The experimental results of the differences $I_{LFT}-I_{RGT}$ drawn in the distribution of FIG. 3 firstly show that the negative results and the positive results are balanced and equilibrated, meaning that the “0s” and “1s” in the final random string of bits R1, R2 are balanced too.

In addition, these results show that if the margin current is chosen at 5 μA (micro Ampere), then the proportion of reliable cells would be about 20% in each sign (negative and positive) and thus 40% of the total population.

Accordingly, if for example in the first region REG1 described in relation with FIG. 2, a memory range (also called memory page) has a size of 1 kB (kilo Bit), then the 40% of reliable pairs would be more than enough to provide a physically unclonable random string of bits for instance used to identify the device, such as to generate a secret key of a cryptography technique.

The present technique for implementing a physically unclonable function proposes to provide a plurality of pairs of phase-change memory cells in a virgin state and having respective effective resistive values; to identify, within an identification mask, the unreliable pairs of cells whose absolute difference between the effective resistive values is less than a margin value and the reliable pairs of cells whose absolute difference between the effective resistive values is greater than the margin value; and to sense the sign of the difference between the effective resistive values of the reliable pairs of cells, for instance to provide a physically unclonable random string of bits.

The distribution of the resistive values of phase-change memory cells in a virgin state provides a natural source of entropy for the unpredictability, while the construction of phase change memory cells provides a strong stability, which is in addition impossible to distinguish by optical or electronic microscopy inspections. The identification mask and the respective configuration of the differential reading ensures that statistical possibility of undetermined or doubtful reads are dismissed.

It emerges that the present technique facilitates implementing a physical unclonable function from a phase change memory, in a reliable and efficient way. The phase change memory can then be used to generate a secret key, and can be securely incorporated into an electronic device such as a microcontroller, for example in industrial or automotive applications, where high security is required.

Figure 4:
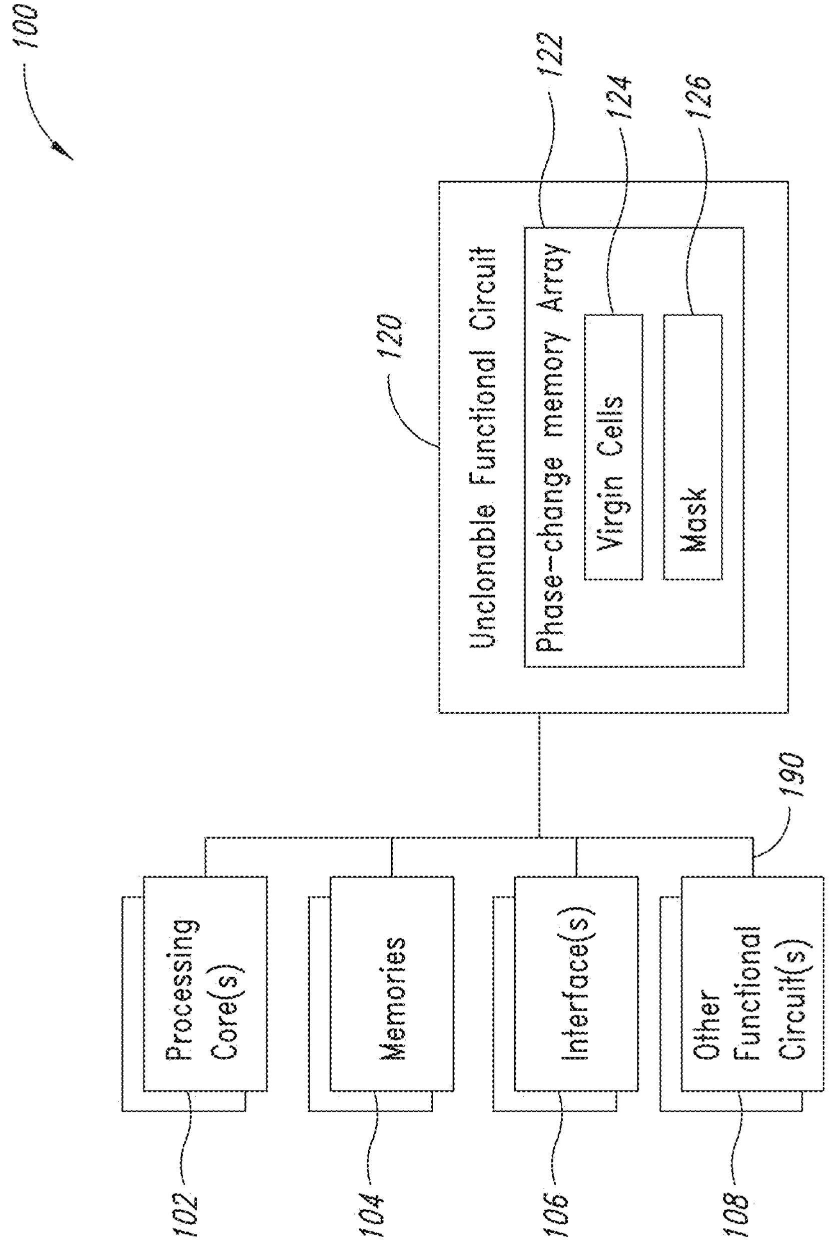
FIG. 4 is a functional block diagram of an embodiment of a system including a physical unclonable function device.

FIG. 4 is a functional block diagram of an embodiment of an electronic device or system 100 of the type to which described embodiments may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100 (e.g., authentication programs, programs which use keys, etc.), etc.

The system 100 includes one or more memories 104, such as one or more volatile and/or non-volatile memories which may store, for example, all or part of instructions and data related to control of the system 100, applications and operations performed by the system 100, etc. One or more of the memories 104 may include a memory array, general purpose registers, etc., which, in operation, may be shared by one or more processes executed by the system 100.

The system 100 includes one or more interfaces 106 (e.g., wireless communication interfaces, wired communication interfaces, etc.), and other functional circuits 108, which may include antennas, power supplies, one or more built-in self-test (BIST) circuits, etc., and a main bus system 190. The main bus system 190 may include one or more data, address, power, interrupt, and/or control buses coupled to the various components of the system 100.

The system 100 also includes one or more unclonable function circuits 120, which in operation may generate a string of bits in accordance with one or more of the methods described herein. As illustrated, the unclonable function circuit 120 comprises a phase-change memory array 122 including a first region 124 having a plurality of pairs of phase-change memory cells in a virgin state and a second region 126 having a plurality of pairs of phase-change memory cells in a written state storing a reliability mask identifying a subset of cells of the plurality of phase-change memory cells in a virgin state of the first region 124.

Embodiments of the system 100 of FIG. 4 may include more components than illustrated, may include fewer components than illustrated, may combine components, may separate components into sub-components, and various combination thereof. For example, the memory 104 may include the phase-change memory array 122 including the first region 124, and second region 126, instead of including the phase-change memory array 122 in the unclonable function circuit 120. In another example, the phase-change memory array 120 may be integrated into the memory 104.

According to an aspect, it is proposed an integrated circuit including a physically unclonable function device comprising a plurality of pairs of phase-change memory cells in a virgin state and having respective effective resistive values, selection means including an identification mask adapted to identify unreliable pairs of cells whose absolute difference between the effective resistive values is less than a margin value and reliable pairs of cells whose absolute difference between the effective resistive values is greater than the margin value, and differential sensing means configured to sense the sign of the difference between the effective resistive values of the reliable pairs of cells according to the identification mask.

For example, the differential sensing means are thus configured to provide a physically unclonable random string of bits, each bit being based on the sensed sign of a respective one of the reliable pairs of cells.

Accordingly, the present aspect proposes to use the distribution of the resistive values of phase-change memory cells in a virgin state as a source of entropy (disorder) for the physically unclonable function. The distribution of the resistive values of phase-change memory cells in a virgin state indeed facilitates providing a true unpredictability according to a gaussian distribution of virgin state's resistive values, a strong stability because of typical low drift of material in a final product, and no observability because of the common virgin state of the phase-change memory cells.

In addition, the identification mask and the differential reading provided by this aspect facilitate ensuring the viability of this technique, in particular to ensure that possible pairs of cells having two equal or very close random resistive values are excluded from the reading procedure, and thus to do not result in indeterminate reads.

According to an embodiment, the identification mask is stored in a non-volatile memory, and comprises a respective unreliability flag or a reliability flag for each pair of cells and linked with the addresses of the respective pairs of cells.

For instance, a non-volatile memory can contain the flags data of identification mask and the addresses of the respective pairs of cells, or, as defined in an embodiment below, the link between the identification mask data and the respective pairs of cells can be provided through the architecture of the array.

According to an embodiment, the integrated circuit comprises a phase-change memory array including the plurality of pairs of cells in a virgin state in a first region, and including a plurality of second pairs of cells in written states configured to store the unreliability flags and reliability flags of the identification mask in a second region.

Thus, the cost and difficulties for producing the device may be reduced since the manufacture of the phase change memory array provides both the cells in a virgin as the source of entropy for the PUF, and the written cells as the non-volatile memory for storing the identification mask. In addition, the phase change memory array can advantageously be produced in the integrated circuit for a general purpose of non-volatile memory, in such a way that the PUF device use only a minor section of the array and is thus practically free of production cost.

According to an embodiment, the position in the second region of each second pair of cells is analogous to the position in the first region of each respective pair of cells, the analogous positions forming the said link with the respective memory addresses.

This embodiment corresponds to an advantageous manner to implement the identification mask with respect to the architecture of the array, such as for example by accessing to both a pair of cells and its respective flag in the identification mask, while selecting only one same bit line. According to an embodiment, in order to identify the reliable and unreliable pairs of cells, the selection means are configured:

- to generate a margin current in a first differential reading path of the differential sensing means and to store a first sign sensed by the differential sensing means of each pair of cells;
- to generate the margin current in a second differential reading path of the differential sensing means and to store a second sign sensed by the differential sensing means of each pair of cells; and
- to compare the first sign and the second sign of each pair of cells and to assign an unreliability flag in the identification mask to the pairs of cells having distinct first sign and second sign, and to assign a reliability flag in the identification mask to the pairs of cells having the same first sign and second sign.

In other words, the reliability flag is assigned to the pairs of cells having a difference between their virgin state resistive values resulting in a difference of current flowing in the differential reading paths greater than the margin current, and the unreliability flag is assigned to the pairs of cells having a difference between their virgin state resistive values resulting in a difference of current flowing in the differential reading paths smaller than the margin current.

According to another aspect, it is proposed a method for implementing a physically unclonable function, comprising:

- providing a plurality of pairs of phase-change memory cells in a virgin state and having respective effective resistive values;
- identifying, within an identification mask, unreliable pairs of cells whose absolute difference between the effective resistive values is less than a margin value and reliable pairs of cells whose absolute difference between the effective resistive values is greater than a margin value; and
- sensing the sign of the difference between the effective resistive values of the reliable pairs of cells.

According to an embodiment, said sensing provides a physically unclonable random string of bits, each bit being based on the sign of a respective one of the reliable pairs of cells.

According to an embodiment, said identifying within an identification mask comprises storing, in a non-volatile memory, a respective unreliability flag or a reliability flag for each pair of cells, and linking the flags with the addresses of the respective pairs of cells.

According to an embodiment, the method comprises providing a phase-change memory array which provides the plurality of pairs of phase-change memory cells in a virgin state in a first region, and provides in addition a plurality of second pairs of phase-change memory cells in a second region, the method comprising a write operation of the second pairs of cells in order to store the unreliability flags and reliability flags of the identification mask.

According to an embodiment, providing the phase-change memory array comprises providing each second pair of cells in an analogous position in the second region to the position in the first region of each respective pair of cells, the analogous positions forming the said link with the memory addresses.

According to an embodiment, identifying the reliable and unreliable pairs of cells comprises:

- generating a margin current in a first differential reading path of a differential sensing means adapted to perform the said sensing, and storing a first sign sensed by the differential sensing means of each pair of cells;
- generating the margin current in a second differential reading path of the differential sensing means and storing a second sign sensed by the differential sensing means of each pair of cells; and
- comparing the first sign and the second sign of each pair of cells and assigning an unreliability flag in the identification mask to the pairs of cells having distinct first sign and second sign, and assigning a reliability flag in the identification mask to the pairs of cells having the same first sign and second sign.

According to an embodiment:

- providing the plurality of pairs of phase-change memory cells in a virgin state is performed during a manufacturing stage of an integrated circuit;
- identifying, into the identification mask, the unreliable pairs and the reliable pairs is performed during an electrical wafer sorting stage of the integrated circuit; and
- sensing the sign of the difference between the effective resistive values of the reliable pairs of phase-change memory cells is performed during a use stage of the integrated circuit.

In an embodiment, unclonable function circuitry includes a plurality of pairs of phase-change memory cells in a virgin state, and sensing circuitry coupled to the plurality of pairs of phase-change memory cells in the virgin state. The sensing circuitry identifies a subset of the plurality of pairs of phase-change memory cells in the virgin state based on a reliability mask. Signs of differences of effective resistance values of the identified subset of the plurality of pairs of phase-change memory cells in the virgin state are sensed by the sensing circuitry. The sensing circuitry generates a string of bits based on the sensed signs of differences in the effective resistance values of the identified subset of the plurality of pairs of phase-change memory cells in the virgin state. Processing circuitry coupled to the unclonable function circuitry, in operation, executes one or more operations using the generated string of bits.

In an embodiment, the sensing circuitry includes a differential sense amplifier, which, in operation, generates an output of the unclonable function circuitry, the output being a physically unclonable random string of bits, each bit being based on a sensed sign of a respective one of the identified subset of the plurality of pairs of phase-change memory cells.

In an embodiment, the reliability mask is stored in a non-volatile memory, and comprises a respective flag indicating a reliability of each pair of cells of the plurality of pairs of phase-change memory cells. In an embodiment, the device comprises a phase-change memory array including: a first region including the plurality of pairs of phase-change memory cells in a virgin state; and a second region including a plurality of second pairs of phase-change memory cells in written states configured to store the reliability mask. In an embodiment, a position in the second region of each second pair of phase-change memory cells is analogous to a position in the first region of a respective pair of phase-change memory cells in a virgin state, the analogous positions forming a link between respective memory addresses of the plurality of pairs of phase-change memory cells in a virgin state and the plurality of second pairs of phase-change memory cells in written states.

In an embodiment, the sensing circuitry, in operation, generates the reliability mask, the generating the reliability mask including, for each pair of phase-change memory cells of the plurality of pairs of phase-change memory cells in a virgin state: generating a first margin current in a first differential reading path of the pair of phase-change memory cells of the plurality of pairs of phase-change memory cells in a virgin state and storing a first sign sensed by the differential sense amplifier; generating a second margin current in a second differential reading path of the pair of phase-change memory cells of the plurality of pairs of phase-change memory cells in a virgin state and storing a second sign sensed by the differential sense amplifier; comparing the first sign to the second sign; and assigning a reliability flag in the reliability mask based on the comparing of the first sign to the second sign.

In an embodiment, a method for implementing a physically unclonable function comprises: identifying a subset of a plurality of pairs of phase-change memory cells in a virgin state based on a reliability mask; sensing signs of differences of effective resistance values of the identified subset of the plurality of pairs of phase-change memory cells in the virgin state; generating a string of bits based on the sensed signs of differences in the effective resistance values of the identified subset of the plurality of pairs of phase-change memory cells in the virgin state; and performing one or more processing operations using the generated string of bits. In an embodiment, the string of bits is a physically unclonable random string of bits, each bit being based on a sensed sign of a respective one of the identified subset of the plurality of pairs of phase-change memory cells. In an embodiment, the method comprises: storing the reliability mask in a non-volatile memory, the reliability mask including a respective flag for each pair of cells of plurality of pairs of phase-change memory cells; and linking the flags with addresses of the respective pairs of cells of the plurality of pairs of phase-change memory cells. In an embodiment, the plurality of pairs of phase-change memory cells in a virgin state are in a first region of a phase-change memory array, and storing the reliability mask comprises storing the reliability mask in a plurality of second pairs of phase-change memory cells in a second region of the phase-change memory array using one or more write operations. In an embodiment, the storing the reliability mask and the linking the flags comprises storing flags in analogous positions in the second region to positions in the first region of respective pair of cells of the plurality of pairs of phase-change memory cells in a virgin state. In an embodiment, the method comprises generating the reliability mask, the generating the reliability mask including, for each pair of phase-change memory cells of the plurality of pairs of phase-change memory cells in a virgin state: generating a first margin current in a first differential reading path of the pair of phase-change memory cells of the plurality of pairs of phase-change memory cells in a virgin state and storing a first sign generated based on the first margin current; generating a second margin current in a second differential reading path of the pair of phase-change memory cells of the plurality of pairs of phase-change memory cells in a virgin state and storing a second sign based on the second margin current; comparing the first sign to the second sign; and assigning a reliability flag in the reliability mask. In an embodiment, the method comprises: manufacturing an integrated circuit including the plurality of pairs of phase-change memory cells in a virgin state; and generating the reliability mask during an electrical wafer sorting stage.

In an embodiment, a system comprises: processing circuitry, which, in operation, executes an application; and unclonable function circuitry coupled to the processing circuitry, wherein the unclonable function circuitry, in operation: identifies a subset of a plurality of pairs of phase-change memory cells in a virgin state based on a reliability mask; senses signs of differences of effective resistance values of the identified subset of the plurality of pairs of phase-change memory cells in the virgin state; and generates a string of bits based on the sensed signs of differences in the effective resistance values of the identified subset of the plurality of pairs of phase-change memory cells in the virgin state, wherein, in operation, the generated string of bits is used by the application. In an embodiment, the unclonable function circuitry includes a differential sense amplifier, which, in operation, generates an output of the unclonable function circuitry, the output being a physically unclonable random string of bits, each bit being based on a sensed sign of a respective one of the identified subset of the plurality of pairs of phase-change memory cells in the virgin state. In an embodiment, the system comprises a phase-change memory array having a first region including the plurality of pairs of phase-change memory cells in a virgin state and a second region including a plurality of second pairs of phase-change memory cells in a written state, wherein the reliability mask is stored the plurality of second pairs of phase-change memory cells in the written state of the second region of the phase-change memory array. In an embodiment, a position in the second region of each second pair of phase-change memory cells is analogous to a position in the first region of a respective pair of phase-change memory cells in the virgin state, the analogous positions forming a link between respective memory addresses of the plurality of pairs of phase-change memory cells in a virgin state and the plurality of second pairs of cells in written states. In an embodiment, the system comprises an integrated circuit including the processing circuitry, the unclonable function circuitry and the phase-change memory array.

In an embodiment, a non-transitory computer-readable medium's contents configure processing circuitry to perform a method, the method comprising: identifying a subset of a plurality of pairs of phase-change memory cells in a virgin state based on a reliability mask; sensing signs of differences of effective resistance values of the identified subset of the plurality of pairs of phase-change memory cells in the virgin state; generating a string of bits based on the sensed signs of differences in the effective resistance values of the identified subset of the plurality of pairs of phase-change memory cells in the virgin state; and performing one or more processing operations using the generated string of bits. In an embodiment, the contents comprise instructions executed by the processing circuitry.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An unclonable function device, comprising:

a plurality of pairs of phase-change memory cells in a virgin state; and sensing circuitry coupled to the plurality of pairs of phase-change memory cells in the virgin state, wherein the sensing circuitry, in operation:

identifies a subset of the plurality of pairs of phase-change memory cells in the virgin state based on a reliability mask;

senses signs of differences of effective resistance values of the identified subset of the plurality of pairs of phase-change memory cells in the virgin state; and generates a string of bits based on the sensed signs of differences in the effective resistance values of the identified subset of the plurality of pairs of phase-change memory cells in the virgin state; and an output coupled to the sensing circuitry, which, in operation, provides the generated string of bits to an executing application.

2. The unclonable function device according to claim 1, wherein the sensing circuitry includes a differential sense amplifier, which, in operation, generates the string of bits, each bit of the string of bits being based on a sensed sign of a respective one of the identified subset of the plurality of pairs of phase-change memory cells.

3. The unclonable function device according to claim 1, wherein the reliability mask is stored in a non-volatile memory, and comprises a respective flag indicating a reliability of each pair of cells of the plurality of pairs of phase-change memory cells.

4. The unclonable function device according to claim 3, comprising a phase-change memory array including:

a first region including the plurality of pairs of phase-change memory cells in a virgin state; and a second region including a plurality of second pairs of phase-change memory cells in written states configured to store the reliability mask.

5. The unclonable function device according to claim 4, wherein a position in the second region of each second pair of phase-change memory cells is analogous to a position in the first region of a respective pair of phase-change memory cells in a virgin state, the analogous positions forming a link between respective memory addresses of the plurality of pairs of phase-change memory cells in a virgin state and the plurality of second pairs of phase-change memory cells in written states.

6. The unclonable function device according to claim 2, wherein the sensing circuitry, in operation, generates the reliability mask, the generating the reliability mask including, for each pair of phase-change memory cells of the plurality of pairs of phase-change memory cells in a virgin state:

generating a first margin current in a first differential reading path of the pair of phase-change memory cells of the plurality of pairs of phase-change memory cells in a virgin state and storing a first sign sensed by the differential sense amplifier;

generating a second margin current in a second differential reading path of the pair of phase-change memory cells of the plurality of pairs of phase-change memory cells in a virgin state and storing a second sign sensed by the differential sense amplifier;

comparing the first sign to the second sign; and assigning a reliability flag in the reliability mask based on the comparing of the first sign to the second sign.

7. The unclonable function device of claim 1, wherein the generated string of bits is a key.

8. The unclonable function device of claim 1, wherein the output comprises an interface, which, in operation, provides the generated string of bits to a processor executing the application.

9. The unclonable function device of claim 8, wherein the generated string of bits is a key.

10. The unclonable function device of claim 1, wherein the sensing circuitry, in operation:

stores the reliability mask in a non-volatile memory, the reliability mask including a respective flag for each pair of cells of plurality of pairs of phase-change memory cells; and links the flags with addresses of respective pairs of cells of the plurality of pairs of phase-change memory cells.

11. A system, comprising:

an interface; and unclonable function circuitry coupled to the interface, wherein the unclonable function circuitry, in operation:

identifies a subset of a plurality of pairs of phase-change memory cells in a virgin state based on a reliability mask;

senses signs of differences of effective resistance values of the identified subset of the plurality of pairs of phase-change memory cells in the virgin state; and generates a string of bits based on the sensed signs of differences in the effective resistance values of the identified subset of the plurality of pairs of phase-change memory cells in the virgin state, wherein, in operation, the interface outputs the generated string of bits.

12. The system of claim 11, comprising:

processing circuitry coupled to the interface, wherein the processing circuitry, in operation, performs one or more operations using the generated string of bits.

13. The system of claim 12, wherein the processing circuitry, in operation, executes an application and the one or more operations are operations of the application.

14. The system according to claim 11, wherein the unclonable function circuitry includes a differential sense amplifier, which, in operation, generates an output of the unclonable function circuitry, the output being a physically unclonable random string of bits, each bit being based on a sensed sign of a respective one of the identified subset of the plurality of pairs of phase-change memory cells in the virgin state.

15. The system according to claim 12, comprising a phase-change memory array having a first region including the plurality of pairs of phase-change memory cells in a virgin state and a second region including a plurality of second pairs of phase-change memory cells in a written state, wherein the reliability mask is stored the plurality of second pairs of phase-change memory cells in the written state of the second region of the phase-change memory array.

16. The system according to claim 15, wherein a position in the second region of each second pair of phase-change memory cells is analogous to a position in the first region of a respective pair of phase-change memory cells in the virgin state, the analogous positions forming a link between respective memory addresses of the plurality of pairs of phase-change memory cells in a virgin state and the plurality of second pairs of cells in written states.

17. The system of claim 15, comprising an integrated circuit including the processing circuitry, the interface, the unclonable function circuitry and the phase-change memory array.

18. The system according to claim 11, comprising a phase-change memory array having a first region including the plurality of pairs of phase-change memory cells in a virgin state and a second region including a plurality of second pairs of phase-change memory cells in a written state, wherein the reliability mask is stored the plurality of second pairs of phase-change memory cells in the written state of the second region of the phase-change memory array.

19. The system of claim 18, comprising an integrated circuit including the interface, the unclonable function circuitry and the phase-change memory array.

* * * * *